United States Patent
Abe et al.

(10) Patent No.: US 11,222,931 B2
(45) Date of Patent: Jan. 11, 2022

(54) DISPLAY DEVICE

(71) Applicant: Sharp Kabushiki Kaisha, Osaka (JP)

(72) Inventors: Kaoru Abe, Sakai (JP); Manabu Niboshi, Sakai (JP); Koji Yamabuchi, Sakai (JP); Shinichi Kawato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 16/633,210

(22) PCT Filed: Jul. 28, 2017

(86) PCT No.: PCT/JP2017/027457
§ 371 (c)(1),
(2) Date: Jan. 23, 2020

(87) PCT Pub. No.: WO2019/021462
PCT Pub. Date: Jan. 31, 2019

(65) Prior Publication Data
US 2020/0243620 A1  Jul. 30, 2020

(51) Int. Cl.
*H01L 27/32* (2006.01)
*H01L 51/52* (2006.01)
*H01L 51/56* (2006.01)

(52) U.S. Cl.
CPC ...... *H01L 27/3227* (2013.01); *H01L 27/3262* (2013.01); *H01L 27/3276* (2013.01); *H01L 51/524* (2013.01); *H01L 51/5271* (2013.01); *H01L 51/56* (2013.01)

(58) Field of Classification Search
CPC ............. H01L 27/3227; H01L 27/3262; H01L 27/3276; H01L 51/524; H01L 51/56
USPC .......................................................... 257/40
See application file for complete search history.

(56) References Cited

U.S. PATENT DOCUMENTS

| | | | |
|---|---|---|---|
| 2006/0244693 | A1 | 11/2006 | Yamaguchi et al. |
| 2008/0054276 | A1 | 3/2008 | Vogel et al. |
| 2010/0156851 | A1 | 6/2010 | Kurokawa |
| 2012/0176298 | A1 | 7/2012 | Suh et al. |
| 2012/0212687 | A1* | 8/2012 | Uchida ............... H01L 27/1214 349/43 |
| 2013/0270618 | A1* | 10/2013 | Fan ..................... H01L 27/1462 257/290 |

(Continued)

FOREIGN PATENT DOCUMENTS

| | | | |
|---|---|---|---|
| JP | 2006-301864 A | 11/2006 | |
| JP | 2008-098617 A | 4/2008 | |

(Continued)

OTHER PUBLICATIONS

Official Communication issued in International Patent Application No. PCT/JP2017/027457, dated Oct. 31, 2017.

*Primary Examiner* — Dzung Tran
(74) *Attorney, Agent, or Firm* — Keating & Bennett, LLP

(57) ABSTRACT

A display device includes a TFT layer, a light-emitting element layer provided in an upper layer than the TFT layer and including a first electrode, a second electrode, and a light-emitting layer of visible light, and a sealing layer covering the light-emitting element layer. An infrared light emission layer and an infrared light detection element are provided in a lower layer than the sealing layer.

18 Claims, 17 Drawing Sheets

(56) References Cited

U.S. PATENT DOCUMENTS

| | | | |
|---|---|---|---|
| 2014/0357010 A1* | 12/2014 | Lu | H01L 27/14687 |
| | | | 438/57 |
| 2015/0194443 A1* | 7/2015 | Chen | H01L 27/124 |
| | | | 257/72 |
| 2015/0243712 A1 | 8/2015 | Wang et al. | |
| 2015/0364527 A1 | 12/2015 | Wang et al. | |
| 2015/0380439 A1* | 12/2015 | Chen | H01L 27/1222 |
| | | | 257/72 |

FOREIGN PATENT DOCUMENTS

| | | |
|---|---|---|
| JP | 2009-288956 A | 12/2009 |
| JP | 2010-170538 A | 8/2010 |
| JP | 2012-145940 A | 8/2012 |
| JP | 2015-162463 A | 9/2015 |
| JP | 2015-225537 A | 12/2015 |
| JP | 2016-134570 A | 7/2016 |

\* cited by examiner

DISPLAY DEVICE

TECHNICAL FIELD

The disclosure relates to a display device.

BACKGROUND ART

PTL 1 discloses an organic EL display with a touch sensor, the organic EL display including a first substrate including a TFT layer and an infrared light emission layer in an upper layer than the TFT layer and a second substrate disposed in an upper layer than the first substrate and including an infrared light detection element.

CITATION LIST

Patent Literature

PTL 1: JP 2015-162463 A (published on Sep. 7, 2015)

SUMMARY

Technical Problem

In the configuration of PTL 1, infrared light may enter the infrared light detection element from below the infrared light detection element, and this causes a problem in that an accuracy of the touch sensor is degraded.

Solution to Problem

A display device according to an aspect of the disclosure is a display device including a TFT layer, a light-emitting element layer provided in an upper layer than the TFT layer and including a first electrode, a second electrode, and a light-emitting layer of visible light, and a sealing layer covering the light-emitting element layer, wherein an infrared light emission layer and an infrared light detection element are provided in a lower layer than the sealing layer.

Advantageous Effects of Disclosure

According to an aspect of the disclosure, an accuracy (sensitivity) of a touch sensor of a display device can be enhanced.

DESCRIPTION OF EMBODIMENTS

In the following description, "the same layer" refers to a layer formed of the same material through the same process as in the layer to be compared, "a lower layer" refers to a layer formed in a process before a process in which the layer to be compared is formed, and "an upper layer" refers to a layer formed in a process after the process in which the layer to be compared is formed.

First Embodiment

Figure 1:
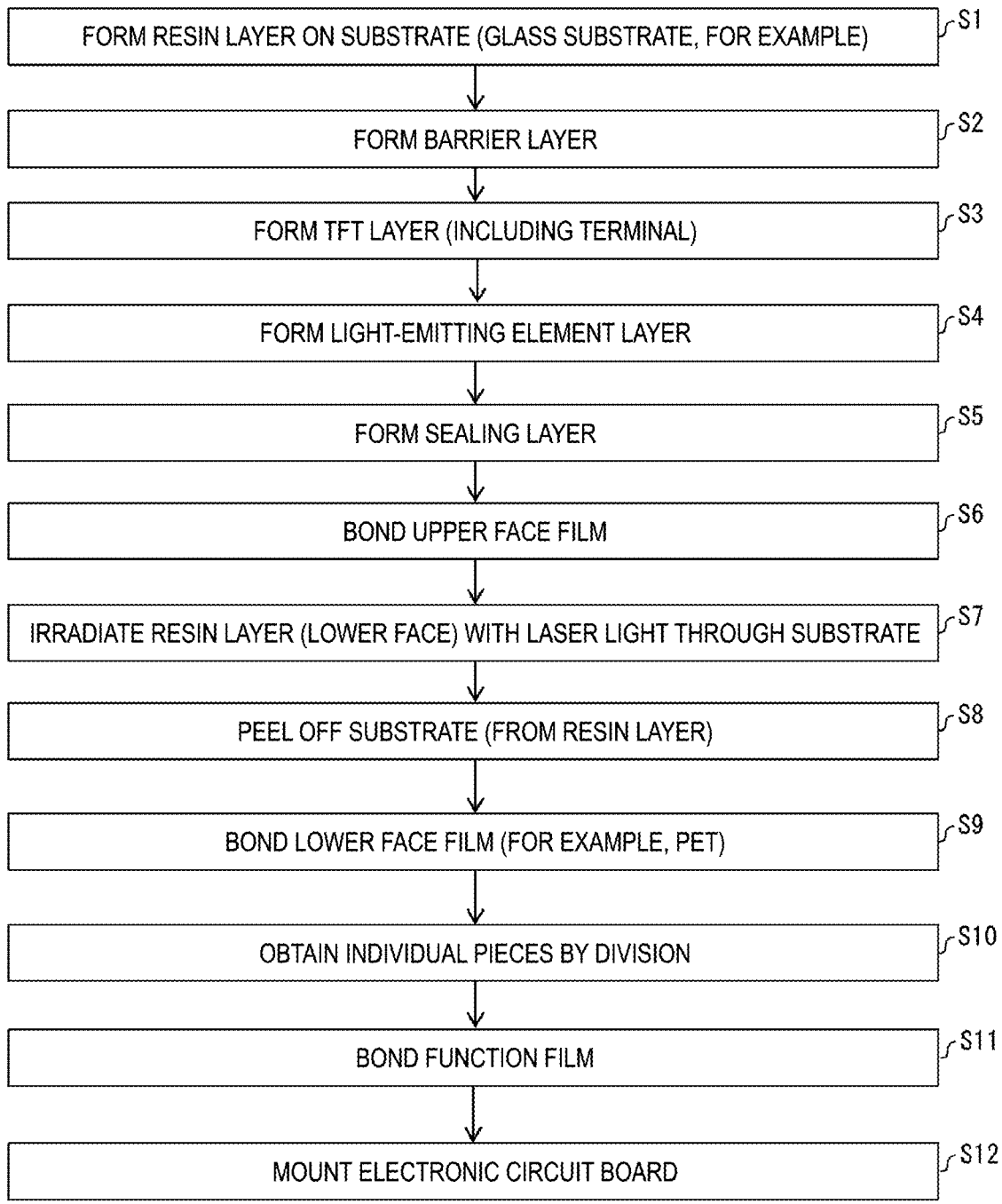
FIG. 1 is a flowchart illustrating an example of a method of manufacturing a display device.

FIG. 1 is a flowchart illustrating an example of a manufacturing method for a display device. FIG. 2(a) is a cross-sectional view illustrating a configuration (a state in which a layered body is formed on a substrate) of a display device during formation, and FIG. 2(b) is a cross-sectional view illustrating a configuration example of a display device. FIG. 3 is a plan view illustrating the configuration (the state in which the layered body is formed on the substrate) of the display device during formation.

Figure 2:
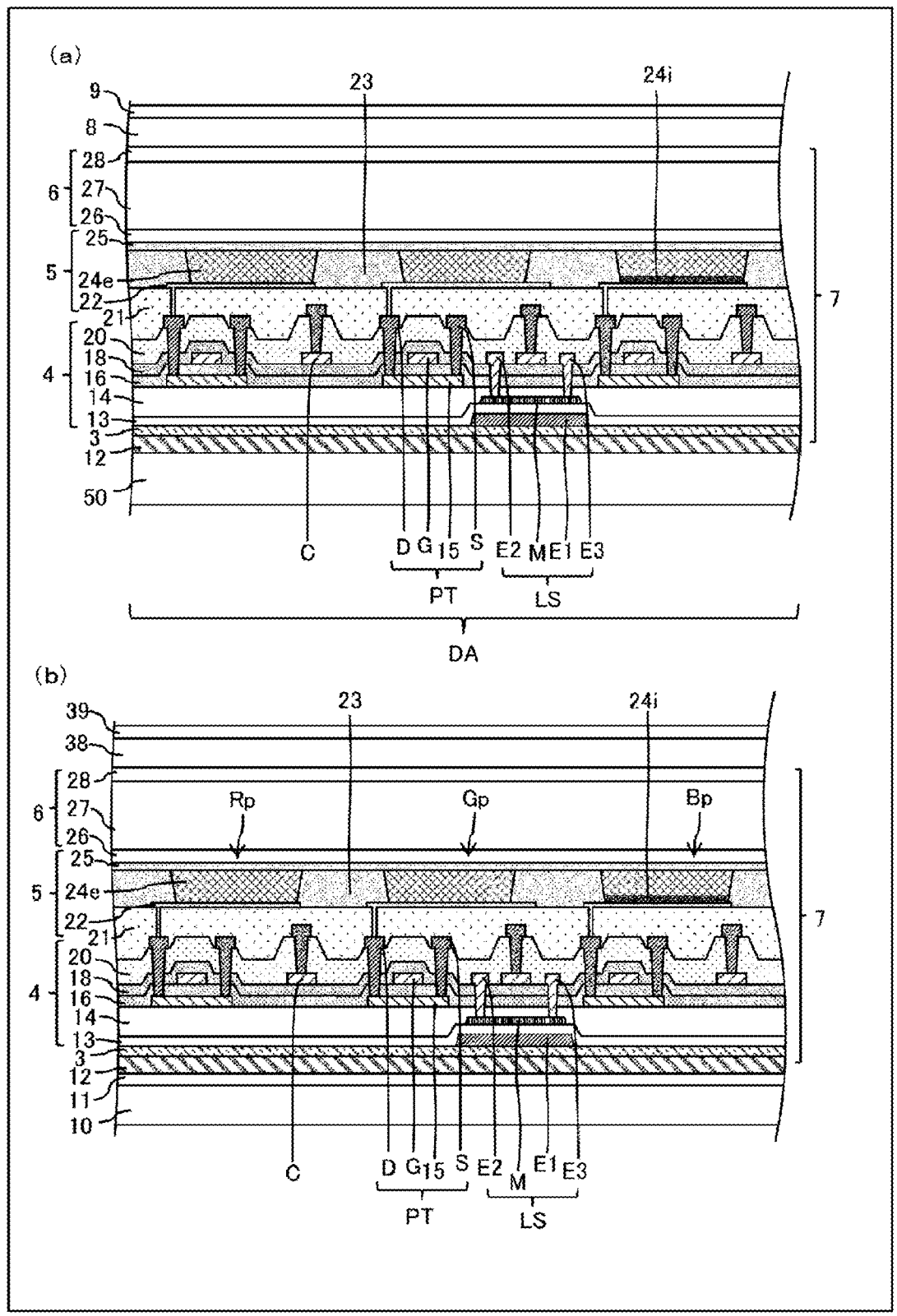
FIG. 2(a) is a cross-sectional view illustrating a configuration (a state in which a layered body is formed on a substrate) of a display device during formation.
FIG. 2(b) is a cross-sectional view illustrating a configuration example of a display device.
Figure 3:
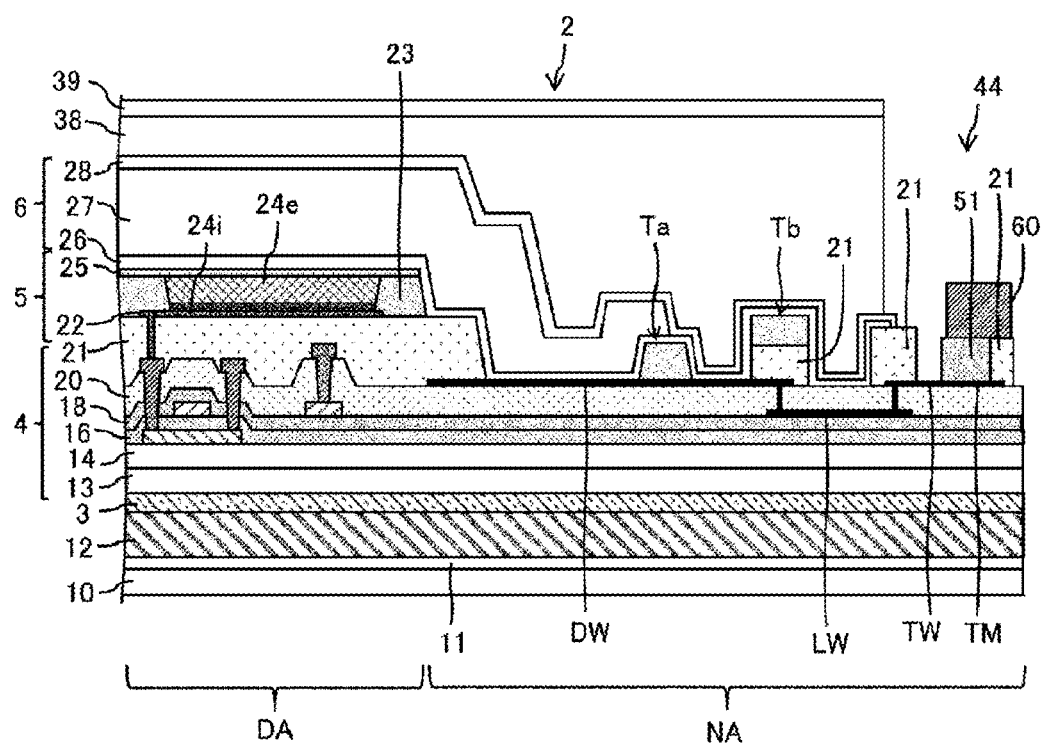
FIG. 3 is a plan view illustrating a configuration (a state in which a layered body is formed on a substrate) of a display device of the present embodiment during formation.

As illustrated in FIGS. 1 to 3, in a case that a flexible display device is manufactured, a resin layer 12 is formed on a transparent substrate 50 (a glass substrate, for example) (step S1). Next, a barrier film 3 is formed (step S2). Next, a TFT layer 4 including an infrared light detection element LS is formed (step S3). Next, a light-emitting element layer 5 including an infrared light emission layer 24i is formed (step S4). Next, a sealing layer 6 is formed (step S5). Next, an upper face film 9 (a PET film, for example) is bonded to the sealing layer 6, with an adhesive layer 8 interposed therebetween (step S6).

Next, a lower face of the resin layer 12 is irradiated with laser light through the substrate 50 (step S7). Here, the resin layer 12 absorbs the laser light with which the lower face of the substrate 50 has been irradiated and that has passed through the substrate 50, and as a result, the lower face of the resin layer 12 (an interface with the substrate 50) alters due to ablation, and a bonding force between the resin layer 12 and the substrate 50 weakens.

Next, the substrate 50 is peeled from the resin layer 12 (step S8). Next, as illustrated in FIG. 2(b), a lower face film 10 (a PET film, for example) is bonded to the lower face of the resin layer 12, with an adhesive layer 11 interposed therebetween (step S9). Then, a layered body including the lower face film 10, the resin layer 12, the barrier layer 3, the TFT layer 4, the light-emitting element layer 5, the sealing layer 6, and the upper face film 9 is divided, and a plurality of individual pieces are cut out (step S10). Next, terminal exposure is performed by peeling a part (a section on a terminal portion 44) of the upper face film 9 off from the individual piece. Next, a function film 39 is bonded to the upper side of the sealing layer 6 of the individual piece, with an adhesive layer 38 interposed therebetween (step S11). Next, an electronic circuit board 60 is mounted onto a terminal portion 44 of the individual piece, using an anisotropic conductive material 51 (step S12).

Examples of the material of the resin layer 12 include polyimide, epoxy, and polyamide. Examples of the material used in the lower face film 10 include polyethylene terephthalate (PET).

The barrier layer 3 is a layer that prevents moisture or impurities from reaching the TFT layer 4 or the light-emitting element layer 5 when the display device is being used and can be configured by a silicon oxide film, a silicon nitride film, or a silicon oxynitride film, or by a layered film of these, which are formed using CVD, for example.

The TFT layer 4 includes a control electrode E1, an inorganic insulating film 13 formed in an upper layer than the control electrode E1, a sensor film M formed in an upper layer than the inorganic insulating film 13 and overlapping the control electrode E1, an inorganic insulating film 14 formed in an upper layer than the sensor film M, a semiconductor film 15 formed in an upper layer than the inorganic insulating film 14, an inorganic insulating film 16 formed in an upper layer than the semiconductor film 15, a gate electrode G formed in an upper layer than the inorganic insulating film 16, an inorganic insulating film 18 formed in an upper layer than the gate electrode G, a capacitance wiring line C and conduction electrodes E2 and E3 formed in an upper layer than the inorganic insulating film 18, an inorganic insulating film 20 formed in an upper layer than the capacitance wiring line C and the conduction electrodes E2 and E3, a source electrode S and a drain electrode D formed in an upper layer than the inorganic insulating film 20, and a flattening film 21 formed in an upper layer than the source electrode S and the drain electrode D.

A thin film transistor PT is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The infrared light detection element LS is configured to include the control electrode E1, the inorganic insulating film 13, and the sensor film M. The infrared light detection element LS is a phototransistor, and the sensor film M is configured by a semiconductor in which electrical characteristics (for example, a current value) change in accordance with a received amount of near infrared light (from 700 nm to 1400 nm). The conduction electrode E2 is connected to an impurity region at one end of the sensor film M, and the conduction electrode E3 is connected to an impurity region at the other end thereof.

The semiconductor film 15 is formed of low-temperature polysilicon (LTPS) or an oxide semiconductor, for example. Note that, the TFT provided with the semiconductor film 15 for forming the channel is illustrated as a top gate structure in FIG. 2; however, the TFT may have a bottom gate structure (in a case that the channel of the TFT is formed in an oxide semiconductor, for example). The sensor film M is formed of amorphous silicon, low-temperature polysilicon (LTPS), or an oxide semiconductor, for example. The oxide semiconductor includes an In—Ga—Zn—O based semiconductor. The In—Ga—Zn—O based semiconductor is a ternary oxide of indium (In), gallium (Ga), and zinc (Zn), and a ratio (a composition ratio) of In, Ga, and Zn is not particularly limited to a specific value, but may be, for example, a ratio of In:Ga:Zn=2:2:1, In:Ga:Zn=1:1:1, In:Ga:Zn=1:1:2, or the like.

The gate electrode G, the control electrode E1, the conduction electrodes E2 and E3, the source wiring line S, the drain wiring line D, and the terminals are each configured by a single-layer metal film or a layered metal film including at least one of aluminum (Al), tungsten (W), molybdenum (Mo), tantalum (Ta), chromium (Cr), titanium (Ti), or copper (Cu), for example.

The inorganic insulating films 13, 14, 16, 18, and 20 may be configured by a silicon oxide (SiOx) film or a silicon nitride (SiNx) film, or a layered film of these, formed through CVD, for example.

The flattening film (interlayer insulating film) 21 may be formed of a coatable photosensitive organic material, such as polyimide or acrylic, for example.

The terminal portion 44 is provided on an end portion (a non-active area NA that does not overlap the light-emitting element layer 5) of the TFT layer 4. The terminal portion 44 includes a terminal TM that is used for connecting with an IC chip or the electronic circuit board 60 such as an FPC and a terminal wiring line TW that is connected to the terminal TM. The terminal wiring line TW is electrically connected to various wiring lines of the TFT layer 4 with a relay wiring line LW and a lead-out wiring line DW interposed therebetween.

The terminal TM, the terminal wiring line TW, and the lead-out wiring line DW are formed in the same process as that of the source electrode S, for example, and thus, are formed in the same layer (on the inorganic insulating film 20) and of the same material (two layers of titanium film and an aluminum film sandwiched between the two layers of titanium film, for example) as those of the source electrode S. The relay wiring line LW is formed in the same process as that of the capacitance wiring line C, for example. End faces (edges) of the terminal TM, the terminal wiring line TW, and the lead-out wiring line DW are covered by the flattening film 21.

The light-emitting element layer 5 (for example, an organic light-emitting diode layer) includes an anode 22 formed in an upper layer than the flattening film 21, a bank 23 defining subpixels (red, green, and blue subpixels Rp, Gp, and Bp) of an active area DA (an area overlapping the light-emitting element layer 5), an infrared light emission layer 24i formed in an upper layer than the anode 22, a light-emitting layer 24e configured to emit visible light formed in an upper layer than the infrared light emission layer 24i, and a cathode electrode 25 formed in an upper layer than the light-emitting layer 24e. The light-emitting element configured to emit visible light (e.g., an organic light-emitting diode: OLED) is configured to include the anode 22, the cathode electrode 25, and the light-emitting layer 24e located therebetween, and an infrared light emission element configured to emit near infrared light (wavelength: from 700 nm to 1400 nm) is configured to include the anode 22, the cathode electrode 25, and the infrared light emission layer 24i located therebetween. As the material of the infrared light emission layer 24i, for example, an organic substance that can be used as a vapor deposition source, such as that described in PTL 1, may be used.

The infrared light emission layer 24i is provided in a predetermined subpixel. Note that the light-emitting layer 24e may be formed directly on the infrared light emission layer 24i, or a buffer layer may be provided between both the layers.

The light-emitting layer 24e is formed in a region (a subpixel region) surrounded by the bank (a partition) 23, through a vapor deposition method or an ink-jet method. Note that a hole injection layer and a hole transport layer may be provided on a surface of the light-emitting layer 24e closer to the anode, and an electron transport layer and an electron injection layer may be provided on a surface thereof closer to the cathode.

The anode (anode electrode) 22 is formed by layering Indium Tin Oxide (ITO) and an alloy containing Ag, for example, and has light reflectivity (described later in more detail). The cathode electrode 25 can be formed of a light-transmissive conductive material such as Indium Tin Oxide (ITO) and Indium Zinc Oxide (IZO).

In a case that the light-emitting element layer 5 is an OLED layer, positive holes and electrons recombine inside the light-emitting layer 24e in response to a drive current between the anode 22 and the cathode electrode 25, and light is emitted as a result of excitons, which are generated by the recombination, falling into a ground state. Since the cathode electrode 25 is translucent and the anode 22 is light-reflective, the visible light emitted from the light-emitting layer 24e travels upwards and results in top emission.

The light-emitting element layer 5 may be used not only in a case of constituting the OLED element, but also in a case of constituting an inorganic light-emitting diode or a quantum dot light-emitting diode. For example, when constituting the quantum dot light-emitting diode, the light-emitting layer 24e may be a quantum dot layer.

A protruding body Ta defining edges of the organic sealing film 27 and a protruding body Tb are formed in the non-active area NA. The protruding body Ta functions as a liquid stopper when the organic sealing film 27 is applied using an ink-jet method, and the protruding body Tb functions as a backup liquid stopper. Note that a lower portion of the protruding body Tb is configured by the flattening film 21, and functions as a protection film for an end face of the lead-out wiring line DW. The bank 23, the protruding body Ta, and an upper portion of the protruding body Tb can be formed in the same process, for example, by using a coatable photosensitive organic material such as a polyimide, an epoxy, or an acrylic.

The sealing layer 6 is light-transmissive and includes a first inorganic sealing film 26 covering the cathode electrode 25, an organic sealing film 27 formed in an upper layer than the first inorganic sealing film 26, and a second inorganic sealing film 28 covering the organic sealing film 27.

The first inorganic sealing film 26 and the second inorganic sealing film 28 may be each configured by a silicon oxide film, a silicon nitride film, or a silicon oxynitride film, or by a layered film of these, formed through CVD. The organic sealing film 27 is thicker than the first inorganic sealing film 26 and the second inorganic sealing film 28, is a light-transmissive organic film, and can be formed of a coatable photosensitive organic material such as a polyimide or an acrylic. For example, after the first inorganic sealing film 26 is coated, by an ink-jet method, with an ink containing such an organic material, the ink is cured by ultraviolet (UV) irradiation. The sealing layer 6 covers the light-emitting element layer 5 and inhibits foreign matter, such as water and oxygen, from infiltrating to the light-emitting element layer 5.

Note that the upper face film 9 is bonded onto the sealing layer 6 with the adhesive layer 8 interposed therebetween, and also functions as a support material when the substrate 50 is peeled off. Examples of a material of the upper face film 9 include polyethylene terephthalate (PET).

The lower face film 10 is formed of PET or the like, and, by being bonded to the lower face of the resin layer 12 after the substrate 50 has been peeled off, functions as a support member and a protection member.

The function film 39 has an optical compensation function, a protection function, or the like, for example. The electronic circuit board 60 is an IC chip or a flexible printed circuit board (FPC) that is mounted on the terminal portion 44, for example.

The description is given for a case of manufacturing a flexible display device, but when a non-flexible display device is manufactured, since the peeling of the substrate or the like is not required, the process may advance from step S6 to step S10 illustrated in FIG. 1, for example.

FIG. 4(a) is a schematic view illustrating a configuration of a display device according to a first embodiment, FIG. 4(b) is a schematic view illustrating a method of driving the display device illustrated in FIG. 4(a), and FIG. 4(c) is a cross-sectional view illustrating a configuration example of the display device illustrated in FIG. 4(a).

In the display device 2, as illustrated in FIGS. 4(a) and 4(c), a touch sensor is configured by a first sensor line Qx extending in a row direction (a horizontal direction), a second sensor line Qy extending in a column direction (a vertical direction), a sensor driver SDx to which the first sensor line Qx is connected, a sensor driver SDy to which the second sensor line Qy is connected, an infrared light emission layer 24i provided in a predetermined pixel (including three subpixels Rp, Gp, and Bp), and an infrared light detection element LS including the control electrode E1, the inorganic insulating film 13, and the sensor film M.

Specifically, one end (an impurity region) of the sensor film M is connected to the first sensor line Qx and the second sensor line Qy with the conduction electrode E2 interposed therebetween, a constant electrical potential is supplied to the conduction electrode E3 connected to the other end (an impurity region) of the sensor film M and the control electrode E1, and as illustrated in FIG. 4(b), a sensing period (a period of detecting the electrical potentials of the first sensor line Qx and the second sensor line Qy using the sensor drivers SDx and SDy) is provided at constant cycles.

As illustrated in FIGS. 4(a) and 4(c), a current of a sensor film M on which infrared light reflected from a finger Fg on the function film 39 is incident is greater than currents of other sensor films (on which infrared light is not incident), and this changes the electrical potential of the first sensor line Qx and the second sensor line Qy, which enables a touch position to be identified.

In the first embodiment, since the infrared light emission layer 24i is provided between the lower anode 22 and the upper cathode electrode 25, and the infrared light detection element LS is provided in a lower layer than the anode 22 (an reflective electrode), infrared light emitted from the infrared light emission layer 24i can be prevented from entering the sensor film M of the infrared light detection element LS directly (without via a finger). This can enhance the accuracy of the touch sensor.

The sensor film M overlaps a gap between the two adjacent anodes 22 and overlaps one of the two anodes 22 but does not overlap the other. This reduces a reflection area that allows light to enter the sensor film M, which can provide a touch sensor with great accuracy.

In addition, since the infrared light emission layer 24i is provided in common with the plurality of subpixels (Rp, Gp, and Bp), the aperture density (a degree of a mask definition) of the vapor deposition mask is reduced to a low degree, and a vapor deposition step is easily performed. Note that the conduction electrodes E2 and E3 are disposed in the same layer as the capacitance wiring line C (formed in the same process as that of the capacitance wiring line C), and this provides an advantage of preventing the number of manufacturing steps for a touch sensor from increasing.

Figure 4:
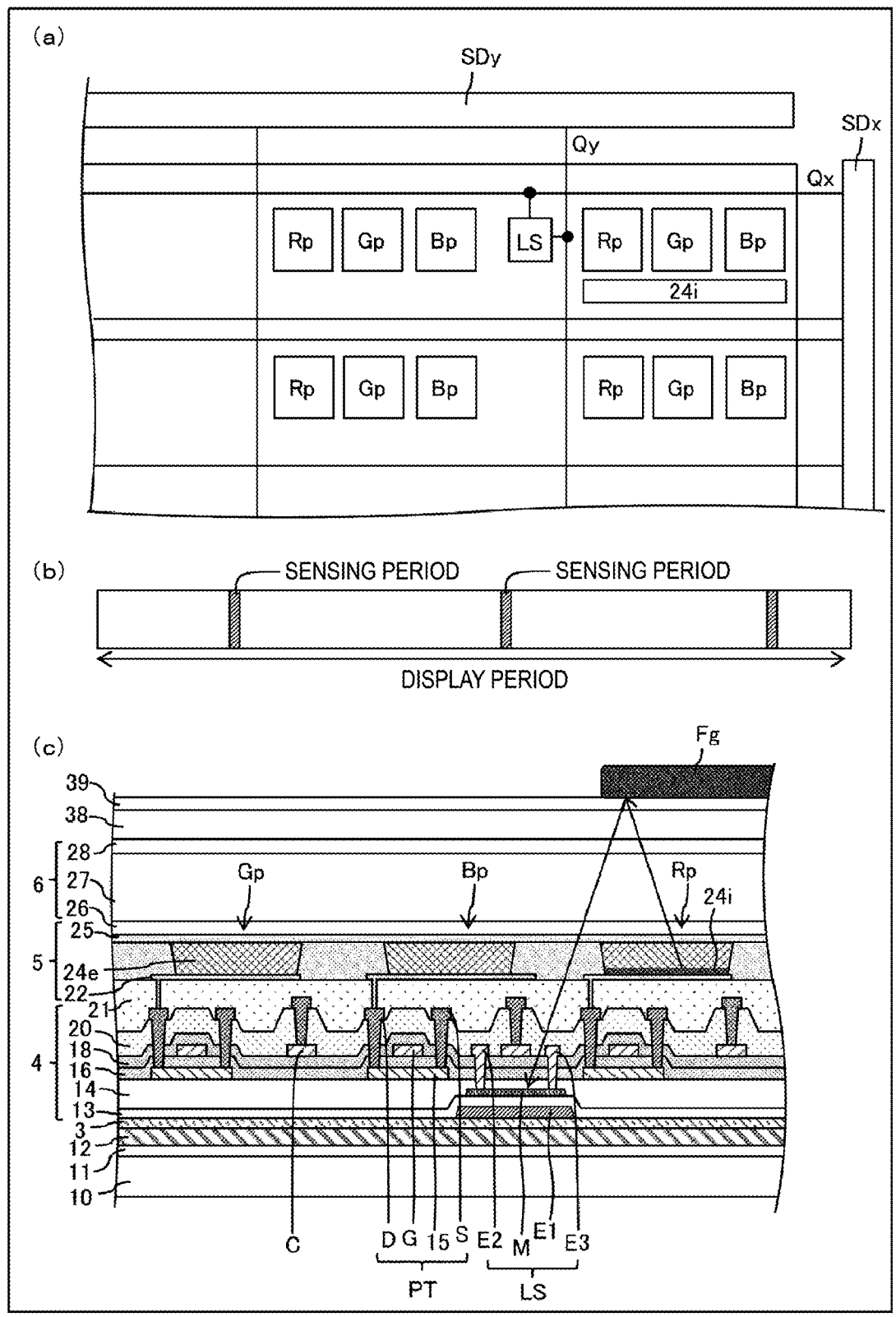
FIG. 4(a) is a schematic view illustrating a configuration of a display device according to a first embodiment.
FIG. 4(b) is a schematic view illustrating a method of driving the display device illustrated in FIG. 4(a)
FIG. 4(c) is a cross-sectional view illustrating a configuration example of the display device illustrated in FIG. 4(a).
Figure 5:
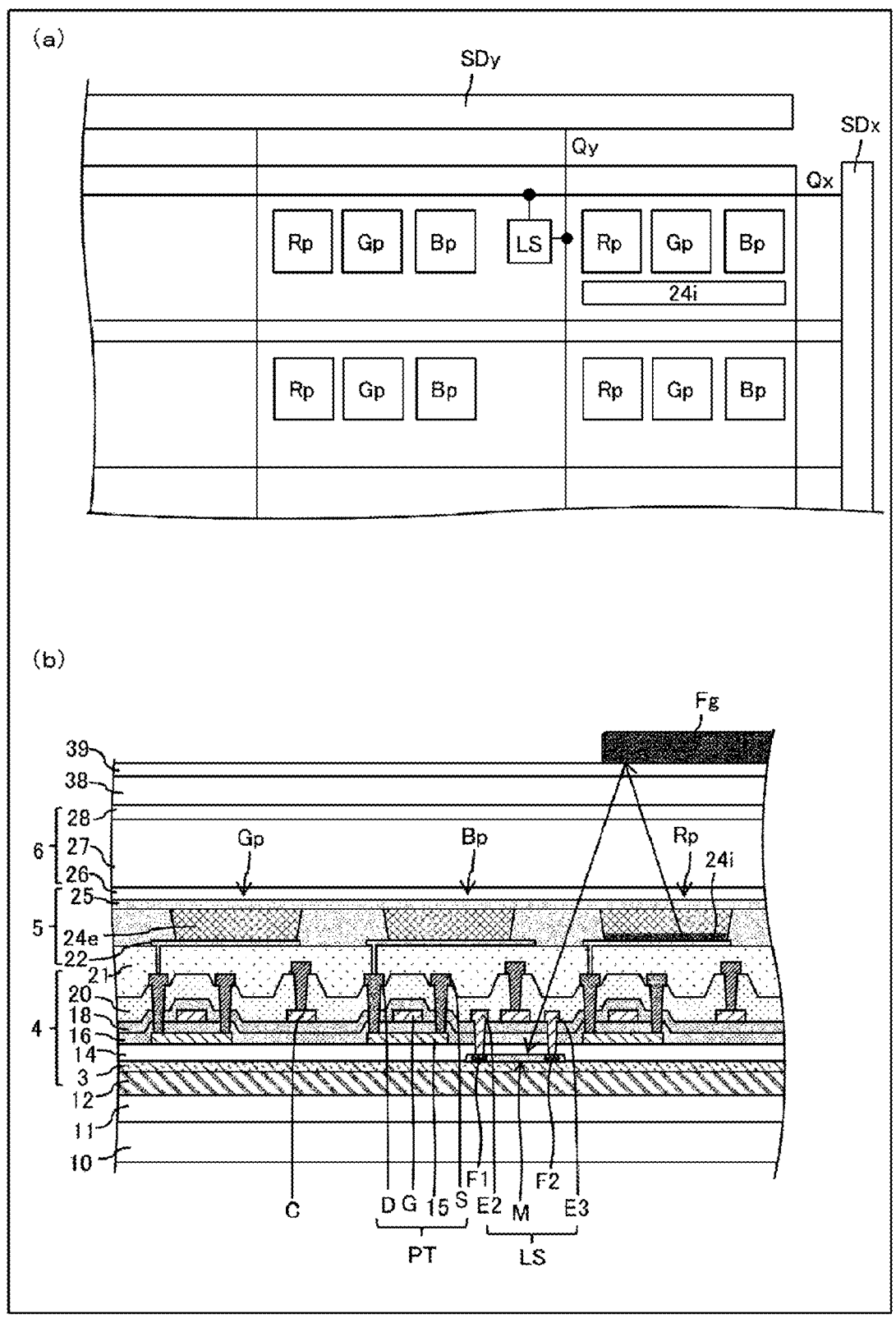
FIG. 5(a) is a schematic view illustrating a modified example of a display device in FIG. 4(a)
FIG. 5(b) is a cross-sectional view illustrating a modified example of the display device illustrated in FIG. 4.

In FIG. 4, the infrared light detection element LS is a phototransistor; however, no such limitation is intended. As illustrated in FIG. 5(b), a configuration is possible in which the infrared light detection element LS is a photodiode including the semiconductor sensor film M, one end (an impurity region F1) of the sensor film M is connected to the first sensor line Qx and the second sensor line Qy with the conduction electrode E2 interposed therebetween, and a constant electrical potential is supplied to the conduction electrode E3 connected to the other end (an impurity region F2) of the sensor film M.

Figure 6:
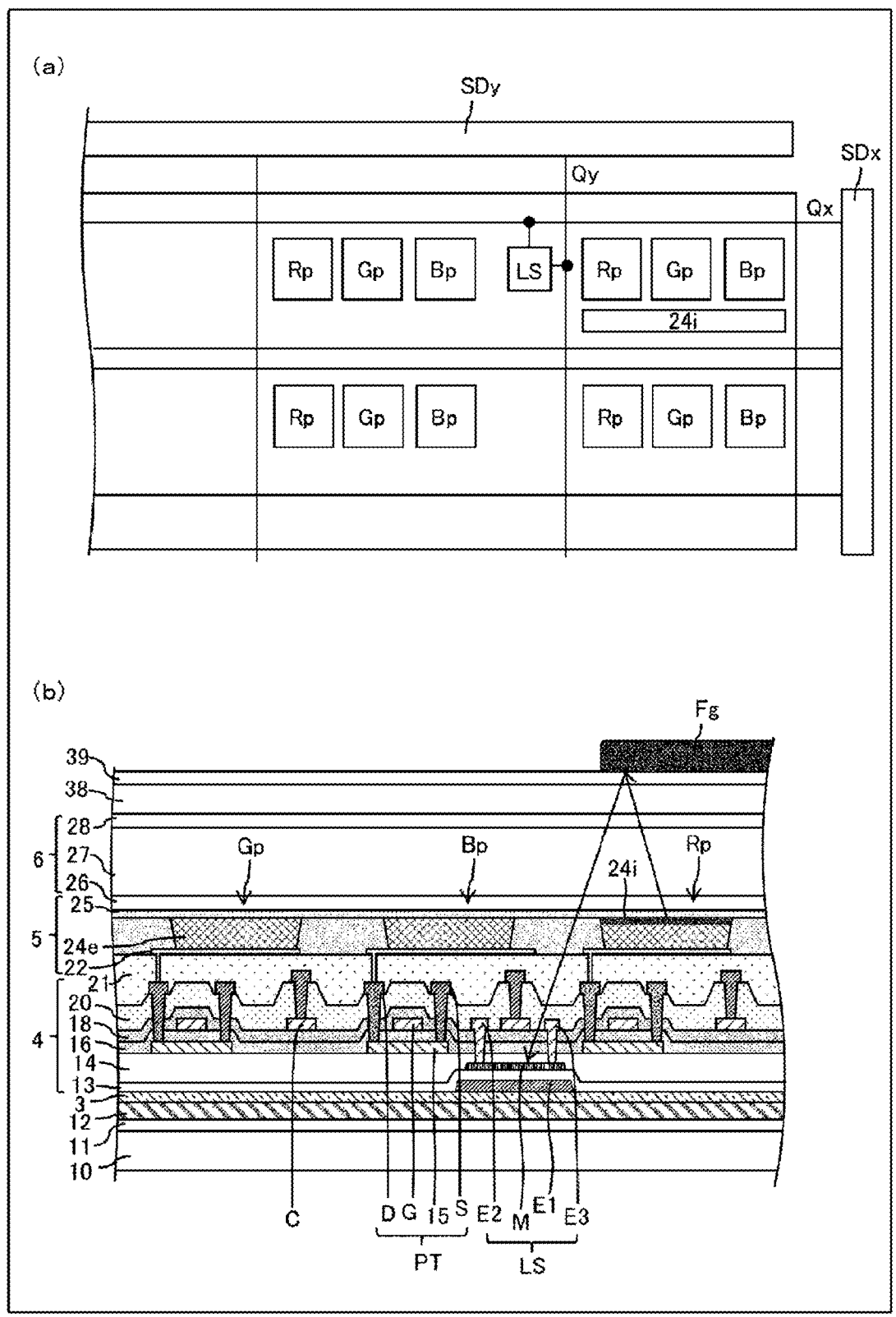
FIG. 6 is a schematic view and a cross-sectional view illustrating another configuration of a display device according to the first embodiment.

In FIG. 4, the infrared light emission layer 24i is formed in a lower layer than the light-emitting layer 24e; however, no such limitation is intended. As illustrated in FIG. 6, the infrared light emission layer 24i common to the plurality of subpixels (Rp, Gp, and Bp) may be formed in an upper layer than the light-emitting layer 24e (and in a lower layer than the cathode electrode 25).

Figure 7:
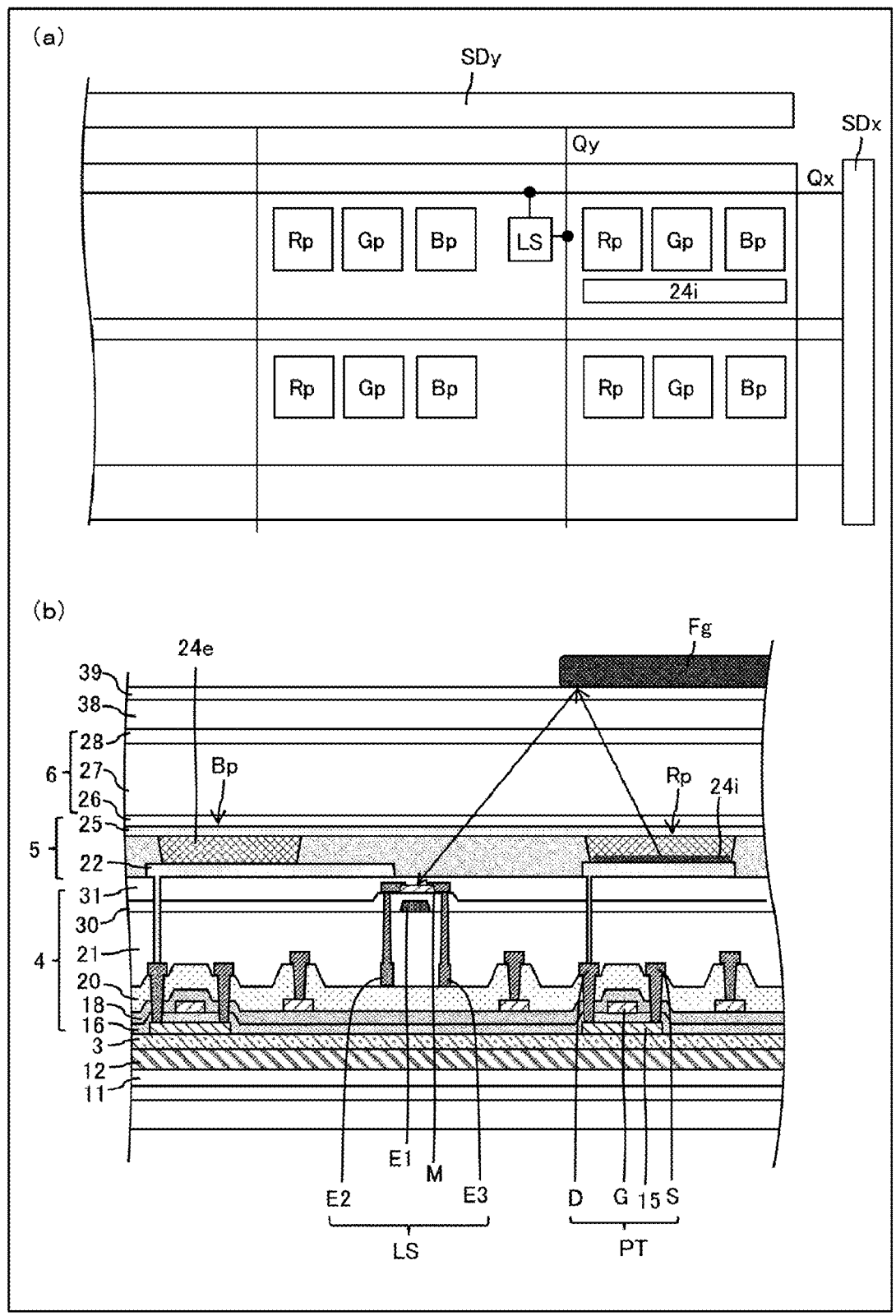
FIG. 7 is a schematic view and a cross-sectional view illustrating yet another configuration of a display device according to the first embodiment.

In FIG. 4, the semiconductor sensor film M of the infrared light detection element LS is formed in a lower layer than the pixel transistor PT; however, no such limitation is intended. As illustrated in FIG. 7, the semiconductor sensor film M may be formed in an upper layer than the flattening film 21, the conduction electrode E2 may be connected to one end of the sensor film M serving as a channel, and the conduction electrode E3 may be connected to the other end thereof.

The TFT layer 4 in FIG. 7 includes the semiconductor film 15, the inorganic insulating film 16 formed in an upper layer than the semiconductor film 15, the gate electrode G formed in an upper layer than the inorganic insulating film 16, the inorganic insulating film 18 formed in an upper layer than the gate electrode G, the capacitance wiring line C formed in an upper layer than the inorganic insulating film 18, the inorganic insulating film 20 formed in an upper layer than the capacitance wiring line C, the source electrode S, the drain electrode D, and the conduction electrodes E2 and E3 formed in an upper layer than the inorganic insulating film 20, the flattening film 21 formed in an upper layer than the source electrode S, the drain electrode D, and the conduction electrodes E2 and E3, the control electrode E1 formed in an upper layer than the flattening film 21, an inorganic insulating film 30 formed in an upper layer than the control electrode E1, the sensor film M formed in an upper layer than the inorganic insulating film 30 and overlapping the control electrode E1, and an inorganic insulating film 31 formed in an upper layer than the sensor film M.

According to the configuration of FIG. 7, a distance between the finger Fg on the function film 39 and the sensor film M is reduced, and the accuracy of the touch sensor is further enhanced.

Figure 8:
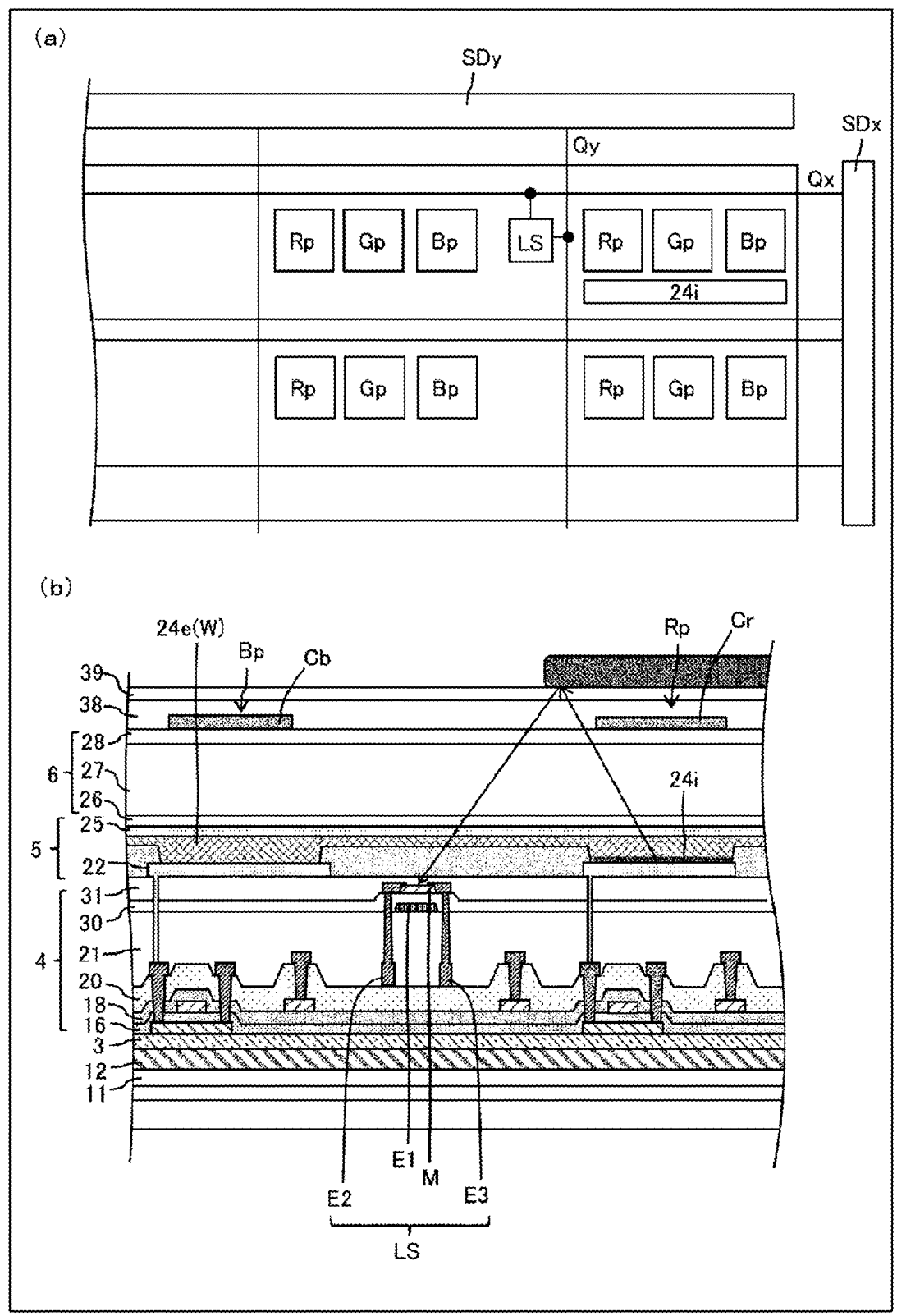
FIG. 8 is a schematic view and a cross-sectional view illustrating yet another configuration of a display device according to the first embodiment.

In FIG. 7 and the like, colors of light emitted from the light-emitting layer 24e differ from each other for each subpixel (Rp, Gp, Bp); however, no such limitation is intended. As illustrated in FIG. 8, a configuration is possible in which color of light emitted from the light-emitting layer 24e is white (W) and common to each subpixel (Rp, Gp, Bp), and color filters (a blue color filter Cb and a red color filter Cr) for the respective subpixels are provided in an upper layer than the sealing layer 6.

Figure 9:
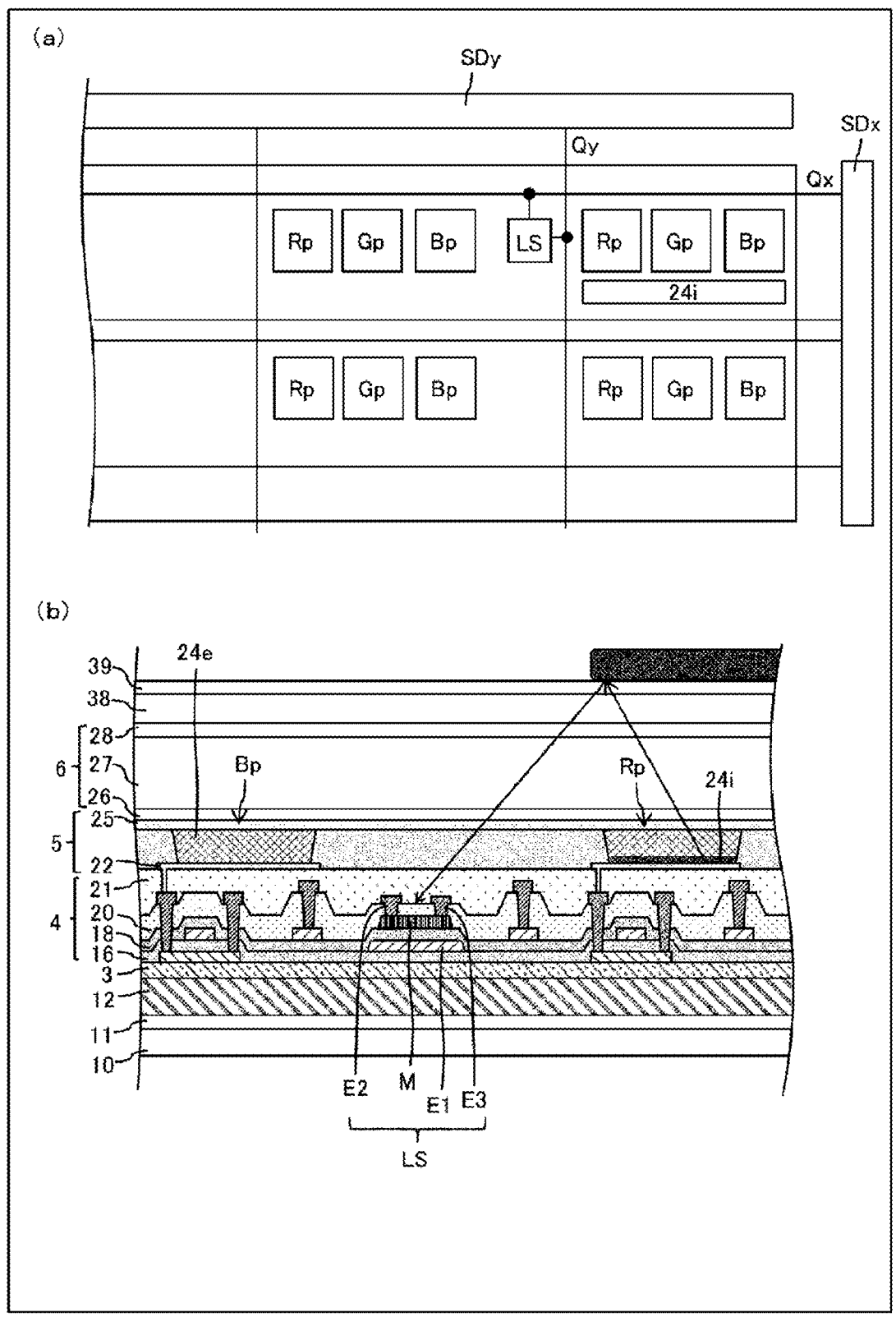
FIG. 9 is a schematic view and a cross-sectional view illustrating yet another configuration of a display device according to the first embodiment.

In FIGS. 7 and 8, the semiconductor sensor film M is formed in an upper layer than the flattening film 21; however, no such limitation is intended. As illustrated in FIG. 9, the semiconductor sensor film M may be formed in an upper layer than the semiconductor film 15 of the pixel transistor PT and in a lower layer than the flattening film 21, the conduction electrode E2 may be connected to one end of the sensor film M serving as a channel, and the conduction electrode E3 may be connected to the other end.

The TFT layer 4 in FIG. 9 includes the semiconductor film 15, the inorganic insulating film 16 formed in an upper layer than the semiconductor film 15, the gate electrode G and the control electrode E1 formed in an upper layer than the inorganic insulating film 16, the inorganic insulating film 18 formed in an upper layer than the gate electrode G, the capacitance wiring line C formed in an upper layer than the inorganic insulating film 18, the sensor film M formed in an upper layer than the capacitance wiring line C, the inorganic insulating film 20 formed in an upper layer than the sensor film M, the source electrode S, the drain electrode D, and the conduction electrodes E2 and E3 formed in an upper layer than the inorganic insulating film 20, and the flattening film 21 formed in an upper layer than the source electrode S, the drain electrode D, and the conduction electrodes E2 and E3.

Figure 10:
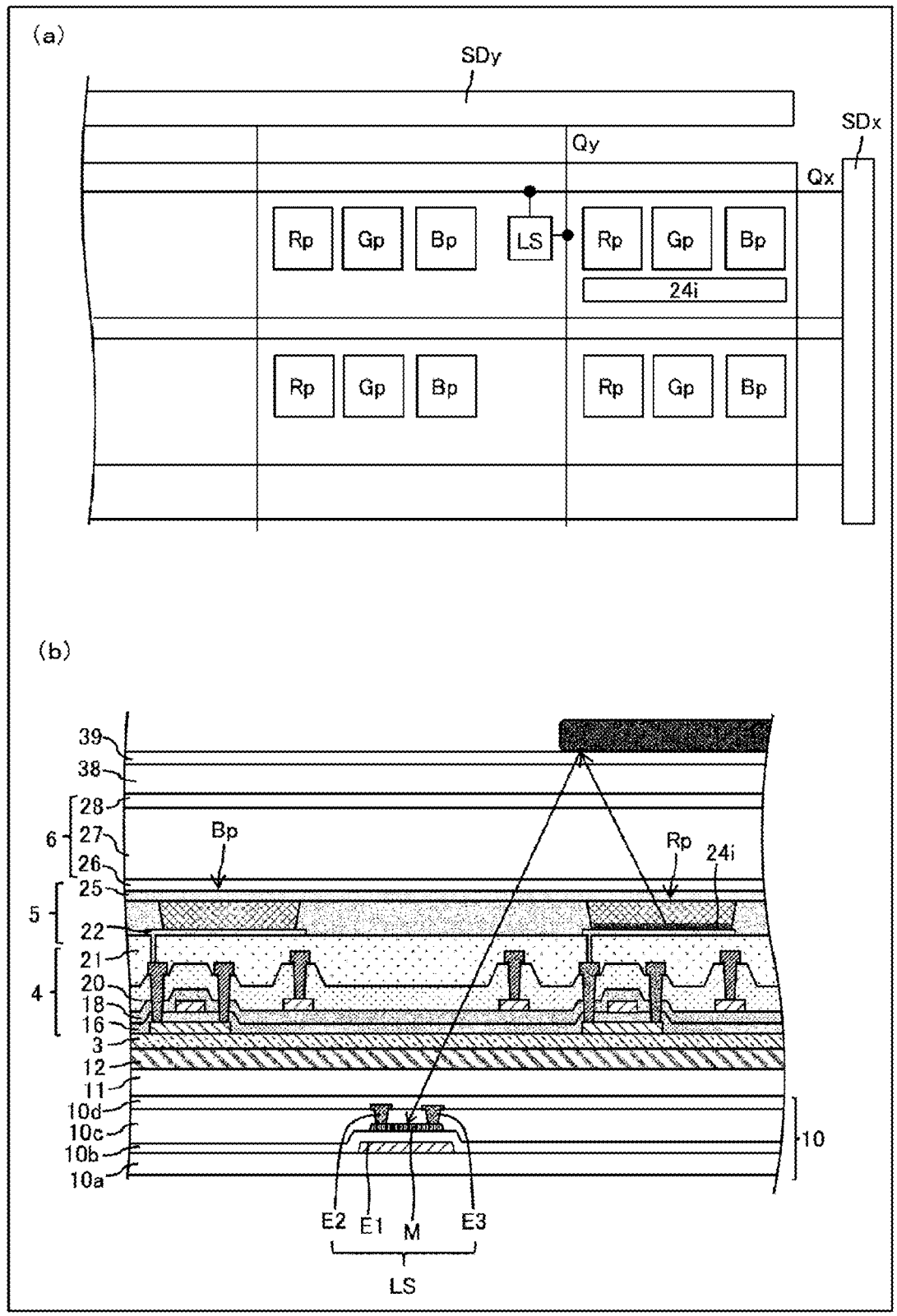
FIG. 10 is a schematic view and a cross-sectional view illustrating yet another configuration of a display device according to the first embodiment.

In FIG. 4 and the like, the infrared light detection element LS is provided in the TFT layer 4; however, no such limitation is intended. As illustrated in FIG. 10, the infrared light detection element LS may be provided in the lower face film 10.

Second Embodiment

In the first embodiment, the light-emitting layer 24e of visible light and the infrared light emission layer 24i are each provided between the anode 22 and the cathode electrode 25 serving as a common electrode; however, no such limitation is intended. FIG. 11(a) is a schematic view illustrating a configuration of a display device according to the second embodiment, FIG. 11(b) is a schematic view illustrating a method of driving the display device illustrated in FIG. 11(a), and FIG. 11(c) is a cross-sectional view illustrating a configuration example of the display device illustrated in FIG. 11(a).

Figure 11:
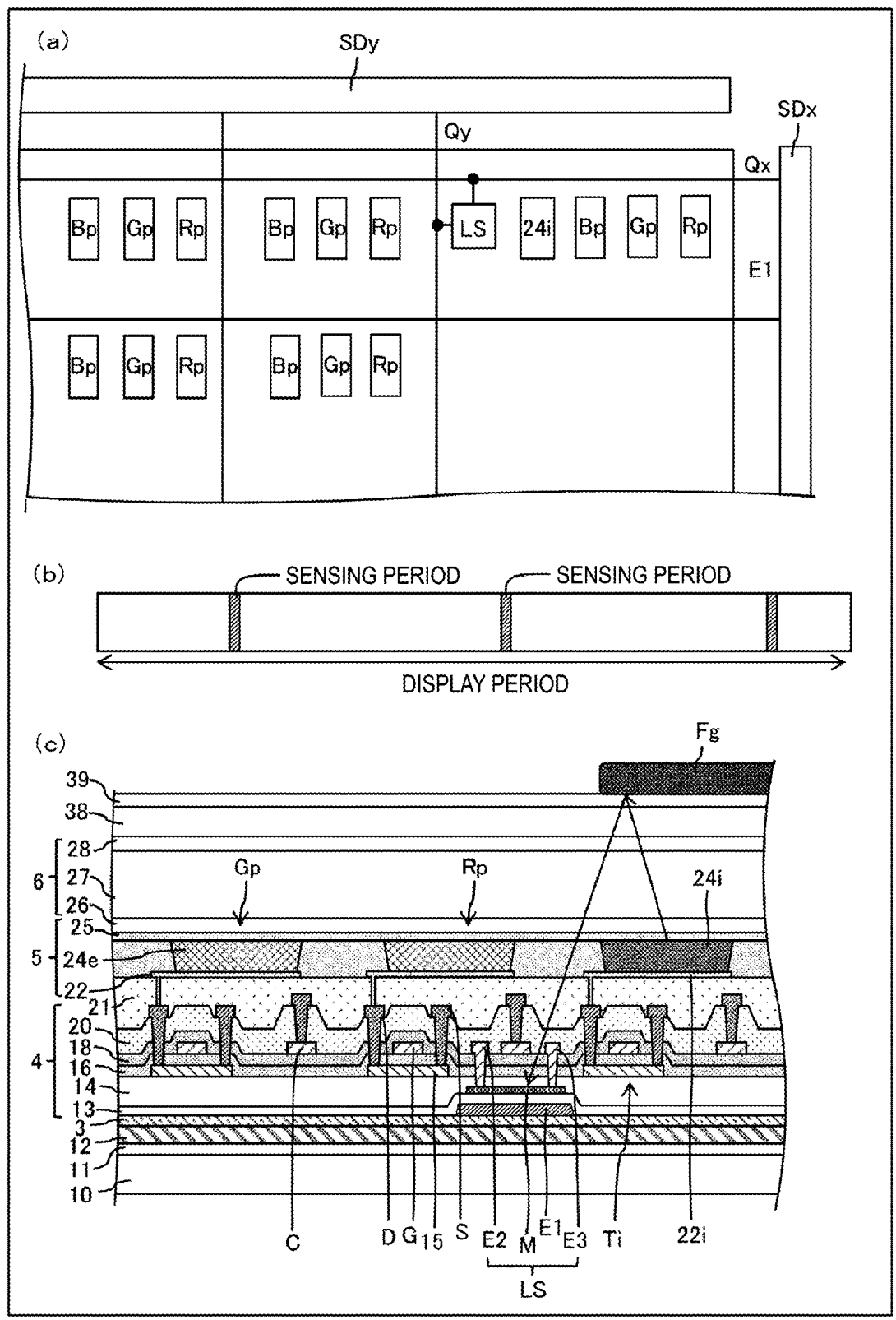
FIG. 11(a) is a schematic view illustrating a configuration of a display device according to a second embodiment.
FIG. 11(b) is a schematic view illustrating a method of driving the display device illustrated in FIG. 11(a)
FIG. 11(c) is a cross-sectional view illustrating a configuration example of the display device illustrated in FIG. 11(a).

As illustrated in FIG. 11, a configuration is possible in which the light-emitting element layer 5 is provided with an anode 22i different from the anode 22, and the infrared light emission layer 24i is provided between the anode 22i and the cathode electrode 25 serving as a common electrode (while the light-emitting layer 24e is provided between the anode 22 and the cathode electrode 25, the infrared light emission layer 24i is not provided). Note that the configuration of the first embodiment is used for the infrared light detection element LS.

This allows the light emission of visible light from the light-emitting layer 24e and the emission of infrared light from the infrared light emission layer 24i to be controlled separately. For example, the transistor Ti connected to the anode 22i is controlled such that the infrared light emission layer 24i emits infrared light for the sensing period, and this control can reduce power consumption.

Third Embodiment

In the first and second embodiments, the sensor film M is provided in a lower layer than the light-emitting element layer 5; however, no such limitation is intended. FIG. 12(a) is a schematic view illustrating a configuration of a display device according to the third embodiment, FIG. 12(b) is a schematic view illustrating a method of driving the display device illustrated in FIG. 12(a), and FIG. 12(c) is a cross-sectional view illustrating a configuration example of the display device illustrated in FIG. 12(a).

Figure 12:
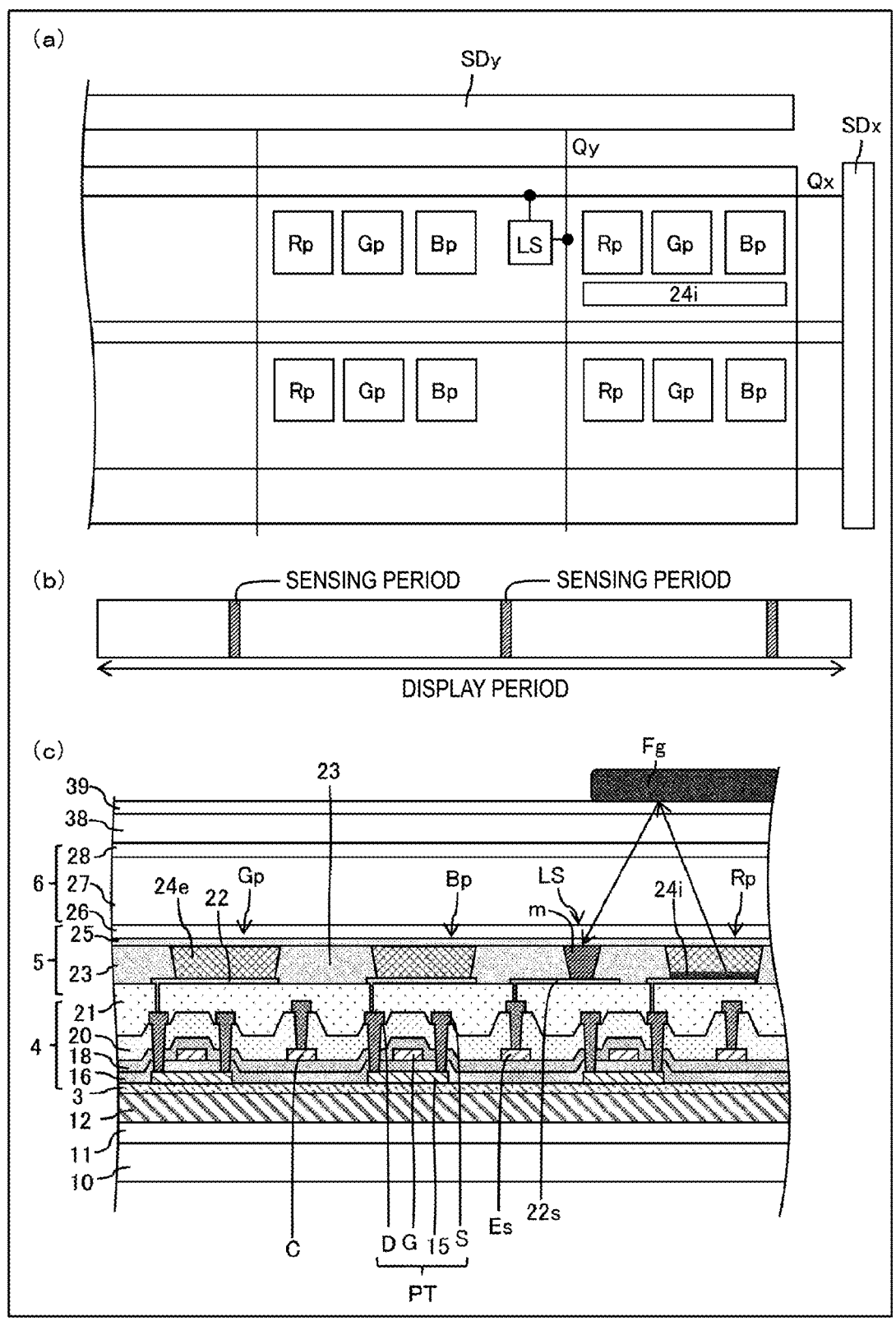
FIG. 12(a) is a schematic view illustrating a configuration of a display device according to a third embodiment.
FIG. 12(b) is a schematic view illustrating a method of driving the display device illustrated in FIG. 12(a)
FIG. 12(c) is a cross-sectional view illustrating a configuration example of the display device illustrated in FIG. 12(a).

As illustrated in FIG. 12, a configuration is possible in which an anode 22s different from the anode 22 is provided in the light-emitting element layer 5, a sensor film m which is an organic film that can be formed by vapor deposition is provided between the anode 22s and the cathode electrode 25 serving as a common electrode, and the infrared light detection element LS (an organic photodiode) includes the anode 22s, the cathode electrode 25, and the sensor film m. The thickness of the sensor film m in FIG. 12 is greater than or equal to the thickness of the sensor film M in FIG. 4 and the like.

In FIG. 12, similar to the first embodiment, the light-emitting layer 24e and the infrared light emission layer 24i are provided between the anode 22 and the cathode electrode 25, and the anode 22s is connected to the first sensor line Qx and the second sensor line Qy with a lead-out electrode Es interposed therebetween. This allows the touch sensor to be configured without adding manufacturing steps of the TFT layer 4. Furthermore, sensor sensitivity can be enhanced because the sensor film m of the infrared light detection element LS is close to a screen.

Note that, in one frame period before the sensing period, dummy measurement can be performed without causing infrared light to be emitted from the infrared light emission layer 24i. By evaluating the sensing results on the basis of the results of the dummy measurement, influences of infrared light other than infrared light reflected from a finger (for example, the influences of infrared light contained in the ambient light, the influences of infrared light leaking directly from the infrared light emission element ID) can be eliminated as much as possible.

Fourth Embodiment

Figure 13:
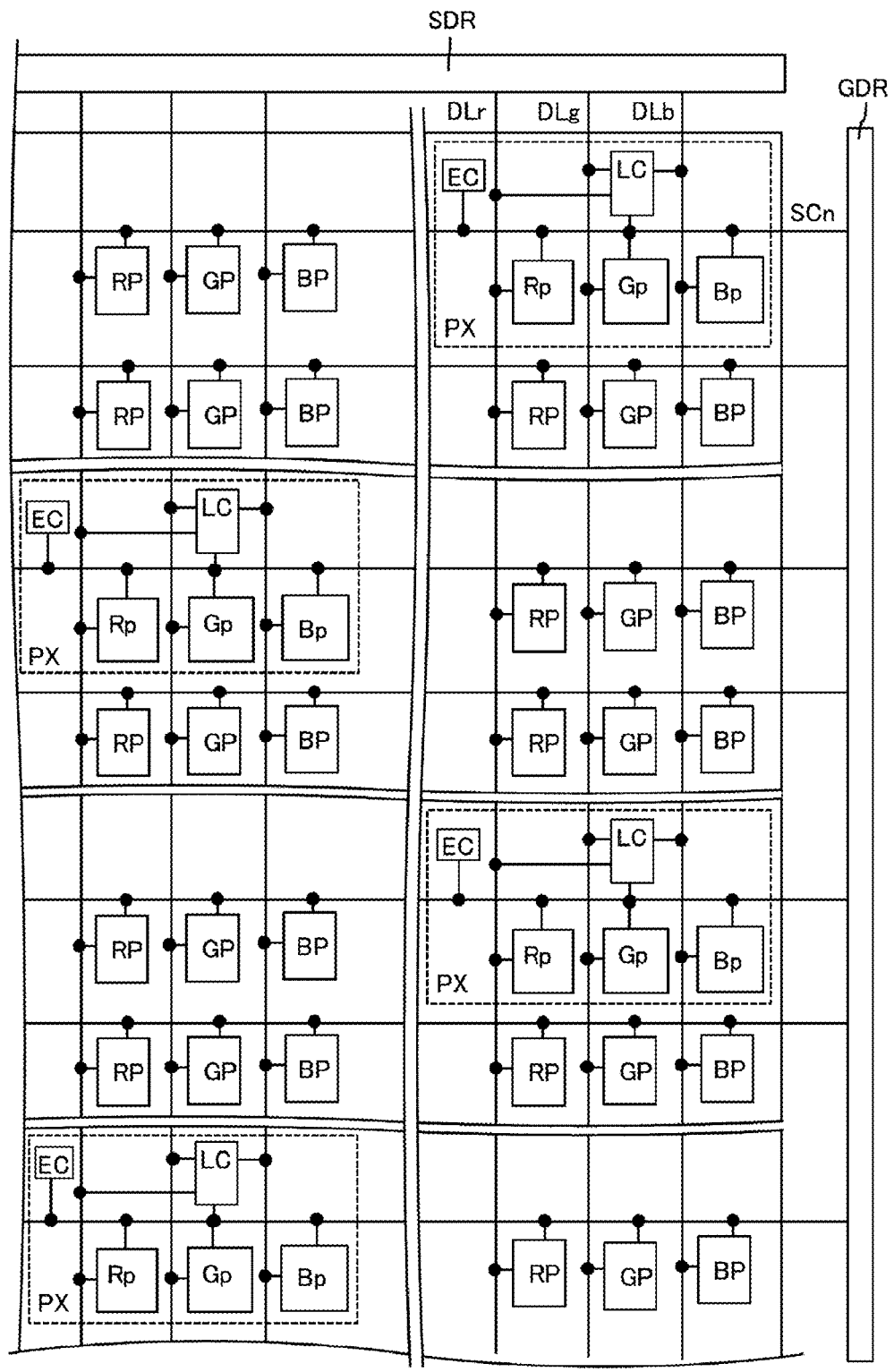
FIG. 13 is a schematic view illustrating a configuration of a display device according to a fourth embodiment.
Figure 14:
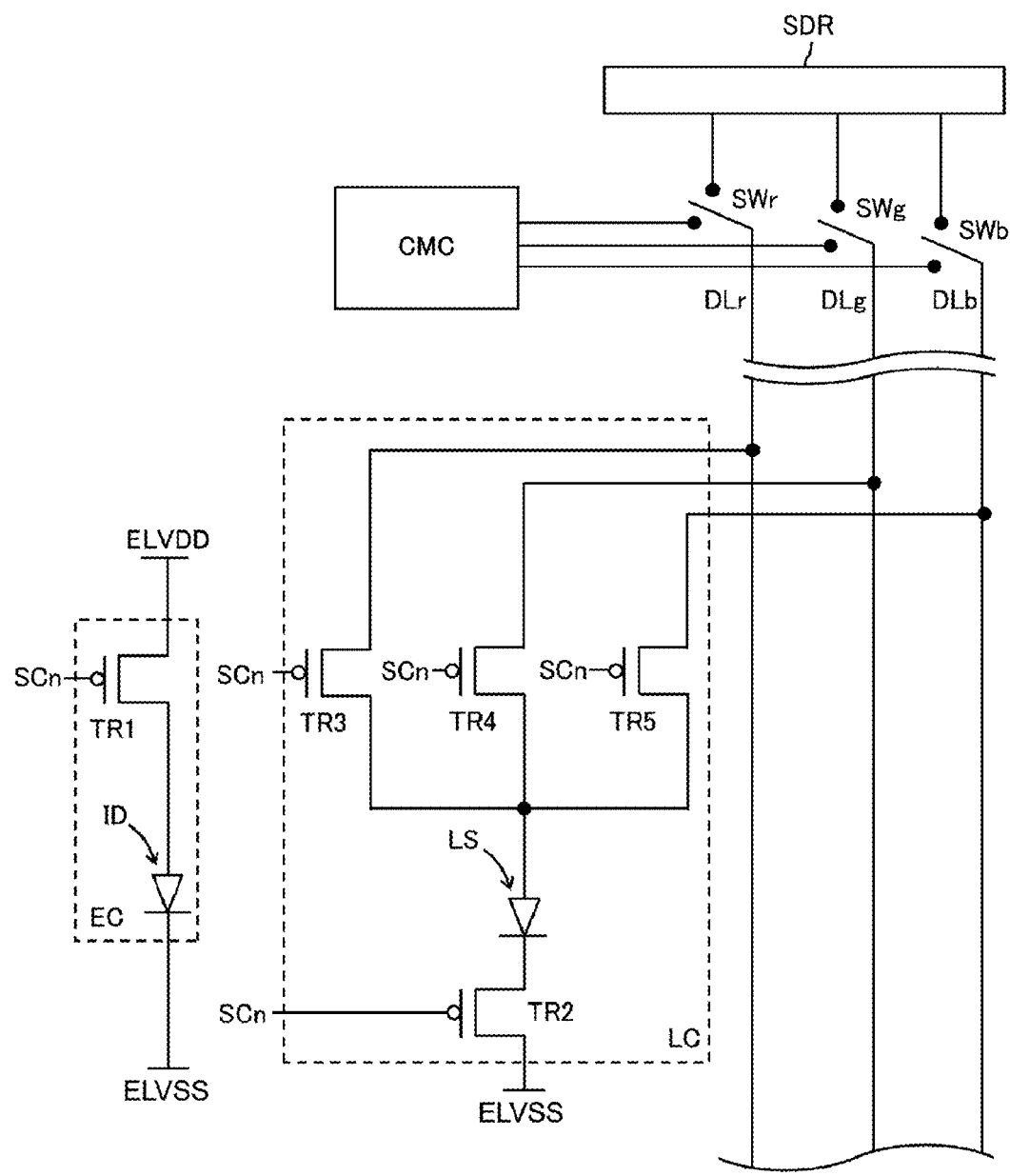
FIG. 14 is a schematic view illustrating a specific example of FIG. 13.
Figure 15:
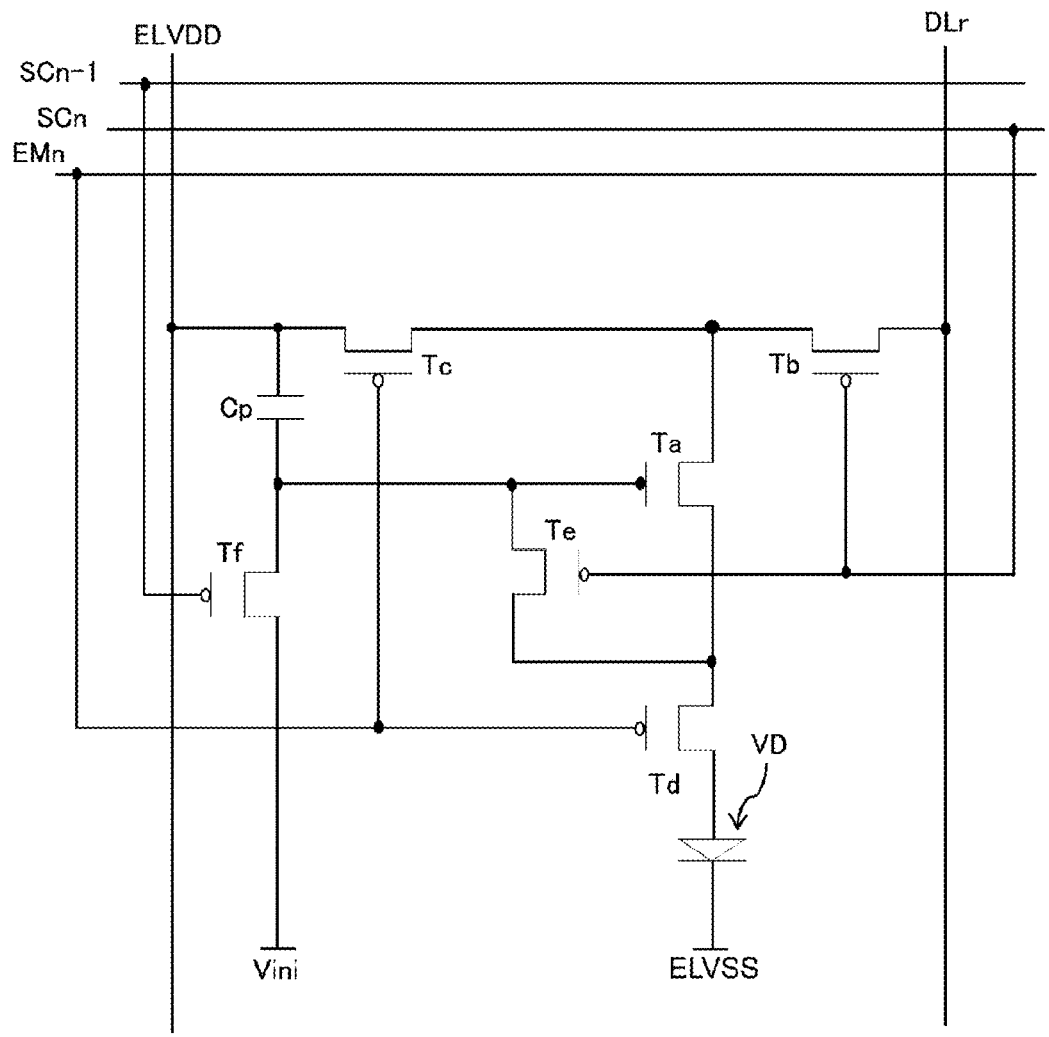
FIG. 15 is a circuit diagram illustrating a subpixel of FIG. 14.

FIG. 13 is a schematic view illustrating a configuration of a display device according to the fourth embodiment. FIG. 14 is a schematic view illustrating a specific example of FIG. 13. FIG. 15 is a circuit diagram illustrating a subpixel in FIG. 14.

In the fourth embodiment, as illustrated in FIG. 13, an infrared light emission circuit EC including the infrared light emission element ID (for example, an infrared light emission diode including an infrared light emission layer) and the infrared light detection circuit LC including an infrared light detection element LS (for example, a photodiode) are provided in a predetermined pixel PX (including subpixels RP, GP, and BP) determined for every several pixels.

In the fourth embodiment, as illustrated in FIG. 14, the infrared light emission circuit EC is connected to a scanning line SCn (a signal line for controlling a writing timing of a gray scale signal to the pixel PX), the infrared light detection circuit LC is connected to data lines (DLr, DLg, and DLb) for supplying the gray scale signal to the pixel PX and to the scanning line SCn, and sensing is performed using the three data lines DLr, DLg, and DLb for a period during which the scanning line SCn is active. The sensing may be performed not for each frame period but for every multiple frame periods with the number thereof being reduced (in a case that the frame frequency is 60 Hz and sensing is performed for every six frame periods, the sensing frequency becomes 10 Hz).

The anode of the infrared light emission element ID (the infrared light emission diode) is connected to an ELVDD (high electrical potential of a power supply) supply line with a transistor TR1 interposed therebetween, and the cathode is connected to an ELVSS (low electrical potential of the power supply) supply line.

The cathode of the infrared light detection element LS (photodiode) is connected to the ELVSS (low electrical potential of the power supply) supply line with a transistor TR2 interposed therebetween, and the anode is connected to the data lines DLr, DLg, and DLb with transistors TR3, TR4, and TR5 interposed therebetween, respectively.

The gate electrodes of the transistors TR1 to TR5 are connected to the scanning line SCn, and the scanning line SCn is connected to a gate driver GDR. The data lines DLr, DLg, and DLb are connected to the source driver SDR or a current measurement circuit CMC with switches SWr, SWg, and SWb interposed therebetween, respectively.

Note that, as illustrated in FIG. 15, the subpixel of the pixel PX includes a drive transistor Ta, a switch transistor Tb connected to the data line DLr and the scanning line SCn, a power supply control transistor Tc connected to the ELVDD supply line, a light emission control transistor Td connected to a light emission control line Emn, a threshold voltage compensation transistor Te, an initialization transistor Tf, a capacitance Cp, which are formed in the TFT layer 4 illustrated in FIG. 2, and a light-emitting element VD (for example, OLED) for visible light formed in the light-emitting element layer 5 in FIG. 2. The gate electrode of the drive transistor Ta is connected to the ELVDD supply line with the capacitance Cp interposed therebetween. The anode of the light-emitting element VD is connected to the light emission control transistor Td, and the cathode is connected to the ELVSS supply line.

As illustrated in FIG. 14, in the sensing period, the transistors TR1 to TR5 are turned ON. The data lines DLr, DLg, and DLb are connected to the current measurement circuit CMC via the switches SWr, SWg, and SWb, and a current flowing from the data line DLr to the transistor TR3, a current flowing from the data line DLg to the transistor TR4, and a current flowing from the data line DLb to the transistor TR5 are measured by the current measurement circuit CMC.

Since a resistance of an infrared light detection element LS where infrared light reflected from a finger is received becomes less than that of an infrared light detection element LS where infrared light is not received, and a measurement becomes great at the current measurement circuit CMC, a touch position (coordinate) can be identified on the basis of a position of a scanning line (a position in a vertical direction) and a position of a data line (a position in a horizontal direction). Note that, the light-emitting element VD of the pixel PX including the infrared light detection circuit LC does not emit light (black) in a frame period during which sensing is performed.

According to the fourth embodiment, sensing can be performed using the data line for driving the pixel PX and the scanning line, and this provides an advantage in that a signal line dedicated for the sensing is not required. Furthermore, since the intensity of the infrared light in the sensing period can be made uniform for in-plane infrared light emission elements and can be made uniform in each sensing, sensing with high accuracy is possible. Note that preferably, TR2, TR3, TR4, and TR5 are a transistor channel of which is formed in an oxide semiconductor having a small leak current.

Note that, in FIG. 14, the three data lines DLr, DLg, and DLb are connected to the infrared light detection circuit LC to reduce electrical resistance thereof; however, no such limitation is intended. A configuration is possible in which one or two of the three data lines DLr, DLg, and DLb are connected to the infrared light detection circuit LC. In a case that the infrared light detection circuit LC is connected to a single data line, only the single data line is connected to the source driver SDR or the current measurement circuit CMC via a switch, and in a case that the infrared light detection circuit LC is connected to the two data lines, only the two data lines are connected to the source driver SDR or the current measurement circuit CMC via switches.

In addition, in FIG. 14, the infrared light emission circuit EC and the infrared light detection circuit LC are connected to the ELVSS supply line; however, no such limitation is intended. The infrared light emission circuit EC and the infrared light detection circuit LC may be connected to a supply line supplied with a constant electrical potential (for example, a common electrical potential) different from the ELVSS.

As illustrated in FIG. 13, in the fourth embodiment, predetermined pixels PX can be disposed in a vertically checkered manner in a plane (a configuration is possible in which predetermined pixels PX are arranged in a vertical direction which is an extending direction of the data line and not arranged in a horizontal direction). This enables the infrared light detection circuits LC to be connected to the same data line, which can reduce the number of input terminals of the current measurement circuit CMC. This can also suppress a decrease in display quality during a frame period during which sensing is performed.

Figure 16:
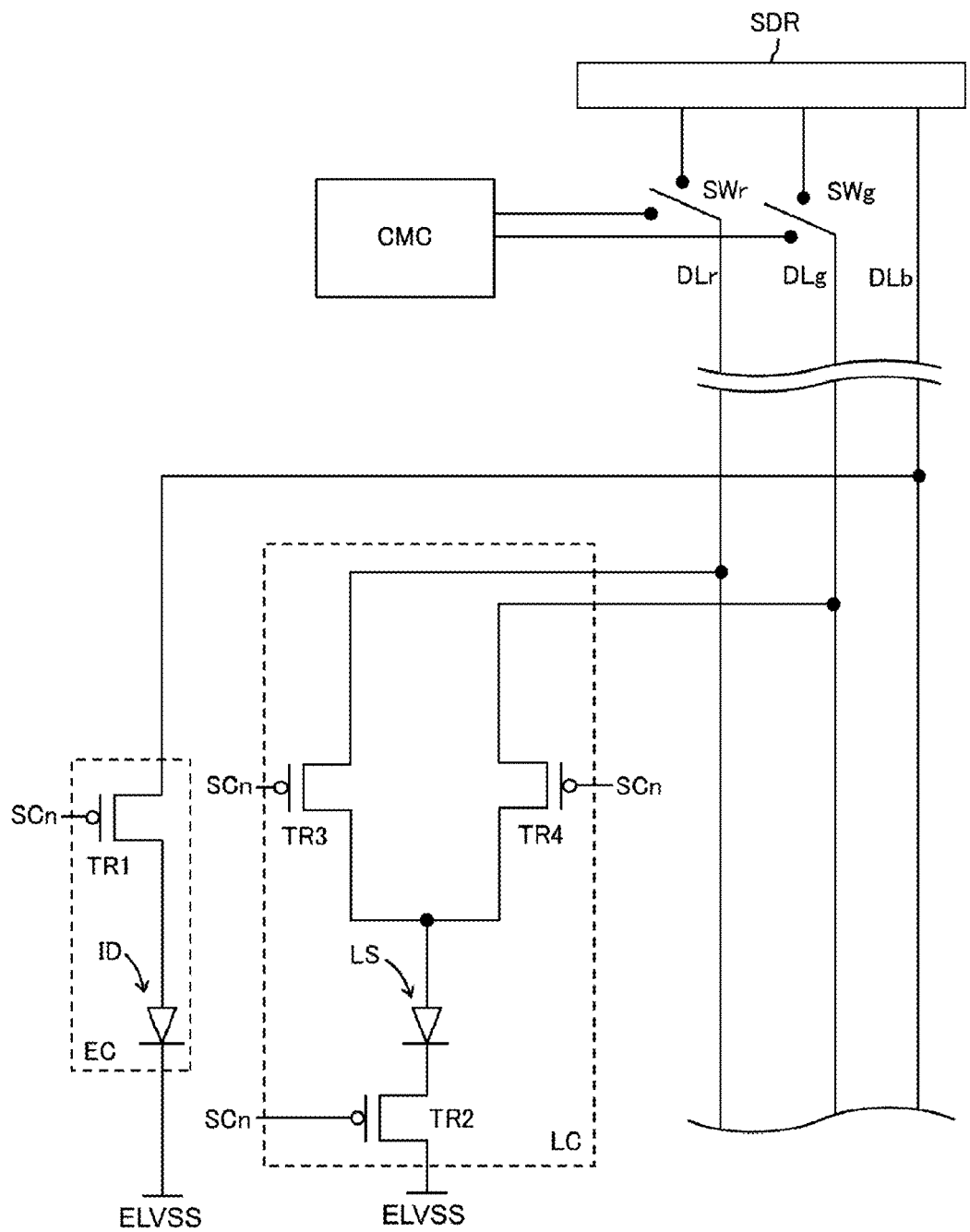
FIG. 16 is a schematic view illustrating a modified example of the fourth embodiment.

In the fourth embodiment, as illustrated in FIG. 16, since the anode of the infrared light emission element ID (the infrared light emission diode) illustrated in FIG. 14 is connected to the data line DLb with the transistor TR1 interposed therebetween, dummy measurement (measurement for a base value) can be performed in a frame period immediately before a frame period in which sensing is performed.

In other words, in the dummy measurement, the switches SWr and SWg are connected to the current measurement circuit CMC, and a current flowing from the data line DLr to the transistor TR3 and a current flowing from the data line DLg to the transistor TR4 are measured with electrical potential which does not cause the infrared light emission element ID to emit light (infrared light is not emitted) being output from the source driver SDR to the data line DLb. In real measurement (sensing), the switches SWr and SWg are connected to the current measurement circuit CMC, and the current flowing from the data line DLr to the transistor TR3 and the current flowing from the data line DLg to the transistor TR4 are measured with electrical potential which causes the infrared light emission element ID to emit light (emit infrared light) being output from the source driver SDR to the data line DLb.

Influences of infrared light other than infrared light reflected from a finger (for example, the influences of infrared light contained in the ambient light, the influences of infrared light leaking directly from the infrared light emission element ID) can be eliminated as much as possible with the results of the dummy measurement.

Figure 17:
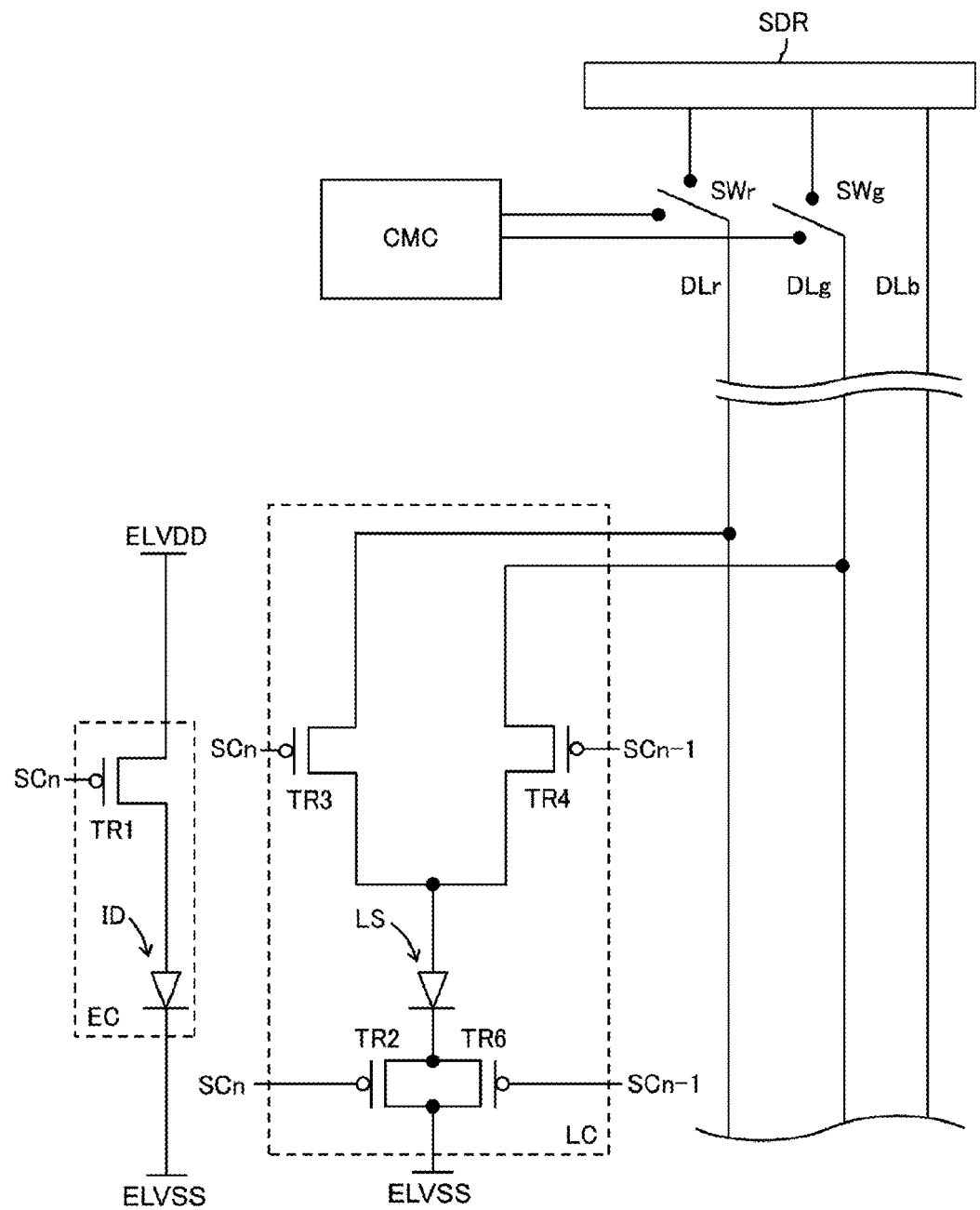
FIG. 17 is a schematic view illustrating a modified example of the fourth embodiment.

In addition, as illustrated in FIG. 17, the transistor TR4 illustrated in FIG. 14 is connected to a scanning line SCn−1 of a former stage, the cathode of the infrared light detection element LS is connected to the ELVSS supply line with a transistor TR6 interposed therebetween, the gate electrode of the transistor TR6 is connected to the scanning line SCn−1, and the infrared light detection circuit LC is not connected to the data line DLb. This configuration allows dummy measurement (measurement for a base value) to be performed before one horizontal scanning period during which sensing is performed. That is, in the dummy measurement, the switch SWg is connected to the current measurement circuit CMC, and the current flowing from the data line DLg to the transistor TR4 is measured while the infrared light emission element ID is caused not to emit light. In the real measurement (sensing), the switch SWr is connected to the current measurement circuit CMC, and the current flowing from the data line DLr to the transistor TR3 is measured while the infrared light emission element ID is caused to emit light.

Supplement

An electro-optical element (an electro-optical element whose luminance or transmittance is controlled by an electric current) that is provided in the display device according to the present embodiment is not particularly limited. Examples of the display device according to the present embodiment include an Organic Electro Luminescence (EL) display provided with an Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device including an TFT layer, a light-emitting element layer provided in an upper layer than the TFT layer and including a first electrode, a second electrode, and a light-emitting layer of visible light, and a sealing layer covering the light-emitting element layer, wherein an infrared light emission layer and an infrared light detection element are provided in a lower layer than the sealing layer.

Second Aspect

The display device according to, for example, the first aspect, wherein the first electrode is provided in a lower layer than the second electrode and configured to reflect the visible light and infrared light.

Third Aspect

The display device according to, for example, the second aspect, wherein the light-emitting element layer includes the infrared light emission layer.

Fourth Aspect

The display device according to, for example, the third aspect, wherein the infrared light detection element is provided in a lower layer than the first electrode.

Fifth Aspect

The display device according to, for example, the third aspect, wherein the infrared light emission layer is provided in a lower layer than the light-emitting layer.

Sixth Aspect

The display device according to, for example, any one of the first to fifth aspects, wherein the infrared light emission layer is provided in a predetermined subpixel.

Seventh Aspect

The display device according to, for example, any one of the first to fourth aspects, wherein the light-emitting element layer includes a third electrode provided in the same layer as a layer of the first electrode, the second electrode is a common electrode provided in common with a plurality of pixels, and the infrared light emission layer is provided between the third electrode and the common electrode.

Eighth Aspect

The display device according to, for example, the first aspect, wherein the infrared light detection element includes a sensor film, and electrical characteristics of the sensor film change in a case that the sensor film receives infrared light.

Ninth Aspect

The display device according to, for example, the eighth aspect, wherein the sensor film is a semiconductor film.

Tenth Aspect

The display device according to, for example, the ninth aspect, wherein a plurality of subpixels are each provided with the first electrode, and the sensor film overlaps a gap between two first electrodes that are provided in two subpixels of the plurality of subpixels, respectively, and are adjacent to each other.

Eleventh Aspect

The display device according to, for example, the tenth aspect, wherein the sensor film overlaps one of the two first electrodes and does not overlap the other.

Twelfth Aspect

The display device according to, for example, the ninth aspect, wherein the sensor film is included in the TFT layer.

Thirteenth Aspect

The display device according to, for example, the ninth aspect, further including a lower face film disposed in a lower layer than the TFT layer, wherein the sensor film is included in the lower face film.

Fourteenth Aspect

The display device according to, for example, the eighth aspect, wherein the sensor film is an organic film.

Fifteenth Aspect

The display device according to, for example, the fourteenth aspect, wherein the light-emitting element layer includes a fourth electrode provided in the same layer as a layer of the first electrode, the second electrode is a common electrode provided in common with a plurality of pixels, and the sensor film is provided between the fourth electrode and the common electrode.

Sixteenth Aspect

The display device according to, for example, any one of the first to fifteenth aspects, wherein the infrared light is near infrared light having a wavelength from 700 nm to 1400 nm, and the infrared light detection element detects the near infrared light reflected from an object on a screen.

Seventeenth Aspect

The display device according to, for example, the sixteenth aspect, wherein a position of the object is determined on the basis of a detection result obtained from the infrared light detection element.

Eighteenth Aspect

The display device according to, for example, any one of the first to seventeenth aspects, wherein an infrared light detection circuit including the infrared light detection element is provided in a predetermined pixel, and the infrared light detection circuit is connected to at least one of a plurality of data lines configured to allow a gray scale signal to be supplied to the predetermined pixel and to a scanning line.

Nineteenth Aspect

The display device according to, for example, the eighteenth aspect, further including a driver configured to drive the plurality of data lines and a current measurement circuit, wherein the display device includes a switch connecting at least one of the plurality of data lines to the driver or the current measurement circuit.

Twentieth Aspect

The display device according to, for example, the nineteenth aspect, wherein the current measurement circuit and the switch are provided in a non-display region.

Twenty-First Aspect

The display device according to, for example, the eighteenth aspect, wherein the infrared light detection circuit is connected to the plurality of data lines.

Twenty-Second Aspect

The display device according to, for example, the eighteenth aspect, wherein an infrared light emission element including the infrared light emission layer is provided, and the infrared light emission element is driven using the scanning line.

Twenty-Third Aspect

The display device according to, for example, the twenty-second aspect, wherein the infrared light emission element is an infrared light emission diode, an anode of the infrared light emission diode is connected to a high-level power supply with a transistor interposed between the anode and the high-level power supply, a gate terminal of the transistor being connected to the scanning line, and a cathode of the infrared light emission diode is connected to a low-level power supply.

Twenty-Fourth Aspect

The display device according to, for example, the eighteenth aspect wherein the infrared light detection element is a photodiode, an anode of the photodiode is connected to a data line of a plurality of data lines with a transistor interposed between the anode and the data line, a gate terminal of the transistor being connected to the scanning line, and a cathode of the photodiode is connected to a low-level power supply with a transistor interposed between the cathode and the low-level power supply, a gate terminal of the transistor being connected to the scanning line.

Twenty-Fifth Aspect

The display device according to, for example, the nineteenth aspect, wherein the current measurement circuit is configured to perform a step of measuring a current flowing through a data line connected to the infrared light detection circuit in a state in which the infrared light emission element does not emit infrared light and a step of measuring a current flowing through a data line connected to the infrared light detection circuit in a state in which the infrared light emission element emits infrared light.

REFERENCE SIGNS LIST

2 Display device
4 TFT layer
5 Light-emitting element layer

6 Sealing layer
12 Resin layer
24e Light-emitting layer
24i Infrared light emission layer
PX Predetermined pixel
ID Infrared light emission element
EC Infrared light emission circuit
VD Light-emitting element (of visible light)
LS Infrared light detection element
LC Infrared light detection circuit
M, m Sensor film

The invention claimed is:

1. A display device comprising:
    a TFT layer;
    a light-emitting element layer provided in an upper layer than the TFT layer and including a first electrode, a second electrode, and a light-emitting layer of visible light; and
    a sealing layer covering the light-emitting element layer, wherein
    an infrared light emission layer and an infrared light detection element are provided in a lower layer than the sealing layer,
    the infrared light detection element includes a sensor film, and electrical characteristics of the sensor film change in a case that the sensor film receives infrared light,
    a plurality of subpixels are each provided with the first electrode,
    the plurality of subpixels include two adjacent subpixels,
    one of the two adjacent subpixels is not provided with the infrared light emission layer, and the other one of the two adjacent subpixels is provided with the infrared light emission layer, and
    the sensor film overlaps a gap between the first electrode included in the one of the two adjacent subpixels not provided with the infrared light emission layer and the first electrode provided in each of the two adjacent subpixels.

2. The display device according to claim 1,
    wherein the first electrode is provided in a lower layer than the second electrode and reflects the visible light and infrared light.

3. The display device according to claim 2,
    wherein the light-emitting element layer includes the infrared light emission layer.

4. The display device according to claim 3,
    wherein the infrared light detection element is provided in a lower layer than the first electrode.

5. The display device according to claim 3,
    wherein the infrared light emission layer is provided in a lower layer than the light-emitting layer.

6. The display device according to claim 1,
    wherein the infrared light emission layer is provided in a predetermined subpixel.

7. The display device according to claim 1,
    wherein the light-emitting element layer includes a third electrode provided in the same layer as a layer of the first electrode,
    the second electrode is a common electrode provided in common with a plurality of pixels, and
    the infrared light emission layer is provided between the third electrode and the common electrode.

8. The display device according to claim 1,
    wherein the sensor film is a semiconductor film.

9. The display device according to claim 1,
    wherein the sensor film does not overlap the first electrode provided in the other one of the two adjacent subpixels.

10. The display device according to claim 8,
    wherein the sensor film is included in the TFT layer.

11. The display device according to claim 8 further comprising:
    a lower face film disposed in a lower layer than the TFT layer,
    wherein the sensor film is included in the lower face film.

12. The display device according to claim 1,
    wherein the sensor film is an organic film.

13. The display device according to claim 12,
    wherein the light-emitting element layer includes a fourth electrode provided in the same layer as a layer of the first electrode,
    the second electrode is a common electrode provided in common with a plurality of pixels, and
    the sensor film is provided between the fourth electrode and the common electrode.

14. The display device according to claim 1,
    wherein the infrared light is near infrared light having a wavelength from 700 nm to 1400 nm, and
    the infrared light detection element detects the near infrared light reflected from an object on a screen.

15. The display device according to claim 14,
    wherein a position of the object is determined on the basis of a detection result obtained from the infrared light detection element.

16. The display device according to claim 1,
    wherein an infrared light detection circuit including the infrared light detection element is provided in a predetermined pixel, and
    the infrared light detection circuit is connected to at least one of a plurality of data lines to supply a gray scale signal to the predetermined pixel and to a scanning line.

17. The display device according to claim 16, further comprising:
    a driver to drive the plurality of data lines; and
    a current measurement circuit,
    wherein the display device includes a switch to connect at least one of the plurality of data lines to the driver or the current measurement circuit.

18. The display device according to claim 17,
    wherein the current measurement circuit and the switch are provided in a non-display region.

* * * * *